United States Patent [19]

Uchikawa et al.

[11] Patent Number: 4,935,046
[45] Date of Patent: Jun. 19, 1990

[54] MANUFACTURE OF A QUARTZ GLASS VESSEL FOR THE GROWTH OF SINGLE CRYSTAL SEMICONDUCTOR

[75] Inventors: Akira Uchikawa; Atsushi Iwasaki, both of Takefu; Toshio Fukuoka, Sabae; Mitsuo Matsumura; Hiroshi Matsui, both of Takefu; Yasuhiko Sato, Annaka; Masaaki Aoyama, Kouriyama; Eiichi Shinomiya, Tokyo; Akira Fujinoki, Kouriyama; Nobuyoshi Ogino, Musashino, all of Japan

[73] Assignees: Shin-Etsu Handotai Company, Limited; Shin-Etsu Quartz Products Co., Ltd., both of Tokyo, Japan

[21] Appl. No.: 278,591

[22] Filed: Dec. 1, 1988

[30] Foreign Application Priority Data

Dec. 3, 1987 [JP] Japan .................................. 62-304624
Dec. 3, 1987 [JP] Japan .................................. 62-304625
Dec. 3, 1987 [JP] Japan .................................. 62-304626

[51] Int. Cl.$^5$ .............................................. C03B 19/04
[52] U.S. Cl. ........................................ 65/18.2; 65/18.1; 65/71; 65/302; 264/101; 264/102; 264/309
[58] Field of Search ................. 65/18.1, 18.2, 71, 302; 264/101, 102, 309

[56] References Cited

U.S. PATENT DOCUMENTS

| | | | |
|---|---|---|---|
| 3,609,829 | 10/1971 | Carrell et al. | 65/302 |
| 4,416,680 | 11/1983 | Brüning et al. | 65/18.1 X |
| 4,528,163 | 7/1985 | Albrecht | 432/264 X |
| 4,632,686 | 12/1986 | Brown et al. | 65/18.1 |
| 4,676,814 | 6/1987 | Röss et al. | 65/18.2 |

FOREIGN PATENT DOCUMENTS

59-213697 12/1984 Japan .

Primary Examiner—Arthur Kellogg
Attorney, Agent, or Firm—Frishauf, Holtz, Goodman & Woodward

[57] ABSTRACT

A quartz glass crucible adapted for use in a process for pulling a single crystal semiconductor material having an opaque outer substrate of a quartz glass with a relatively high bubble content and an inner transparent glass layer which is substantially free from bubbles. The crucible is produced while the substrate is supported by a rotating mould by forming an atmosphere of high temperature gas and supplying a metered quantity of powders of quartz to the high temperature gas atmosphere to have the quartz powders molten at least partly and directed toward an inner surface of the substrate to be adhered thereon.

10 Claims, 9 Drawing Sheets

MAX. ROUGHNESS: 33.7μm

MAX. ROUGHNESS: 85μm

MAG. POWER 20

MAG. POWER 20

MANUFACTURE OF A QUARTZ GLASS VESSEL FOR THE GROWTH OF SINGLE CRYSTAL SEMICONDUCTOR

BACKGROUND OF THE INVENTION

1. Field of the Invention

The present invention relates to a quartz glass vessel adapted for use in a process for the growth of single crystal material such as a single crystal silicon material.

2. Description of the Prior Art

Conventionally, in producing a single crystal such as a single crystal silicon semiconductor material, the so-called "Czochralski" method has been widely adopted. According to the method, polycrystalline silicon is molten in a vessel and a seed crystal is dipped at its tip end portion into the melt. Then, the seed is pulled while it is being rotated so that a single crystal is grown on the seed with the same crystallographic orientation.

As the vessel adapted for the pulling of a single crystal, use is made of a quartz crucible. The quartz crucible is classified in accordance with the external appearance entailed by the difference in the production methods into a transparent crucible having a relatively low bubble content and an opaque crucible having a high content of minute bubbles to provide an opaque appearance. The latter crucible will hereinafter be referred to as the "opaque crucible".

The opaque crucible is produced by a process in which powders of quartz are introduced into a mould to be accumulated to form a layer along the inner surface of the mould. The layer of the quartz powder is then heated at the inner surface thereof while the mould is being rotated to produce a crucible of a glass having a relatively high bubble content. The opaque quartz crucible is advantageous in that it has a higher strength as compared with a transparent crucible and it is relatively easy to form a crucible of a large size. Further, minute bubbles contained in the opaque crucible contribute to uniformize the thermal distribution. From the reasons stated above, the opaque crucible has widely been used in practice.

It should however be noted that with the conventional crucible of opaque type it has been experienced in the process of producing a single crystal that crystallization becomes unstable with the result that the yield is decreased. There may be several reasons for the instability of crystallization. Among the reasons for the instability, one which is caused by the crucible is that the inner surface of the crucible is eroded due to a reaction under an elevated temperature between the silicon melt and the quartz glass so that irregularities are produced in the inner surface of the crucible. As the erosion further progresses, the bubbles which have been contained in the crucible are exposed to the silicon melt. When the irregularities are thus produced in the location where the crucible is kept in contact with the silicon melt, the surface of the melt cannot be lowered smoothly as the quantity of the melt decreases causing fluctuations of the melt surface. It should further be pointed out that minute projetions produced in the roughened surface of the crucible can become nucleus of crystallization of quartz glass forming spotty crystobalites on the quartz crucible. The crystals thus formed may be separated from the crucible as the pulling process progresses and fallen into the silicon melt. The crystals thus fallen into the silicon melt will have an adverse effect on the growth of the crystal which is being pulled.

A further problem is that metallic impurities may be concentrated in the vicinity of the inner surface of the quartz crucible, for example, at the surfaces of the minute bubbles and the concentrated metallic impurities are heated in the process of pulling the crystal to thereby enhance the crystallization of the crystobalites producing spotty crystobalites. From similar reasons, it is not preferable that the crucible has minute projections and scratches at the time when the crucible is formed.

In order to solve the aforementioned problems experienced in the conventional quartz crucible, the Japanese laid-open patent application 59-213697 teaches to form an opaque quartz crucible produced as described above with a layer of transparent quartz glass of at least 1 mm thick on the inner surface of the crucible at least at a portion where the crucible is brought into contact with the melt. Such a layer of transparent quartz glass is formed by heating the inner surface of an opaque quartz glass crucible for a long time period. It should however be noted that the transparent quartz glass layer formed in accordance with the teaching of the laid-open patent application is not satisfactory because the bubble content is not sufficiently low but still contains a certain amount of minute bubbles. According to recent technologies for pulling a single crystal, the process is carried out under an atmosphere of a reduced pressure and the quartz crucible formed in accordance with the teaching of the Japanese laid-open patent application has a tendency that the bubbles in the crucible are expanded under a reduced pressure which the crucible is subjected to during the single crystal pulling process. Thus, problems are encountered even in this type of crucible as experienced in the conventional crucible.

The U.S. Pat. No. 4,528,163 teaches to form a crucible substrate with an outer layer made of powders of natural quartz and an inner layer made of powders of synthetic quartz. The crucible substrate is then heated at the inner surface to form a thin smooth layer of an amorphous nature. However, as in the case of the transparent glass layer of the Japanese laid-open patent application, the amorphous layer formed in accordance with the teaching of the U.S. patent contains noticeable quantity of bubbles or voids.

The U.S. Pat. Nos. 4,416,680 and 4,632,686 teach to decrease the bubble content by applying a suction pressure to the external surface of the quartz crucible while the crucible is being heated. It should however be noted that the process as taught by the U.S. patents are not effective to decrease the bubble content because the bubbles are subjected to a substantial resistance in passing through the layer of quartz glass.

It should further be noted that in the process of pulling a single crystal it is required in addition to the stabilization of the pulling operation to maintain an accurate control of oxygen which is transferred from the crucible to the single crystal which is being pulled. However, in the quartz crucible made in accordance with the conventional process, the inner surface is apt to be roughened in the pulling operation due to the fact that the inner layer of the crucible is not satisfactorily uniform and that the crucible contains substantial quantity of bubbles. Therefore, the quantity of the quartz which is molten from the crucible into the melt becomes instable and it becomes difficult to accomplish the requirements of accurate control of the oxygen transfer.

A further problem encountered in the conventional quartz crucible is that the crucible is apt to be locally deformed during the pulling operation when the crucible is subjected to a high temperature for a long period of time. The technologies as taught by the Japanese laid-open patent application and the aforementioned U.S. patents are not effective to solve the problem.

SUMMARY OF THE INVENTION

It is therefore an object of the present invention to provide a quartz crucible adapted for a single crystal pulling process, the crucible having a smooth and uniform inner surface and an inner layer substantially free from bubbles.

Another object of the present invention is to provide a quartz crucible which has a stable dissolving rate of the crucible material into the melt during the single crystal pulling process and has a minimum possibility of causing crystobalites on the inner surface.

Still further object of the present invention is to provide a quartz crucible in which the inner surface can be maintained smooth even during the single crystal pulling process so that the pulling process can be carried out with a satisfactory stability.

Still further object of the present invention is to provide a quartz crucible which shows a high physical stability even under a high temperature to which the crucible is subjected in a single crystal pulling process.

Yet further object of the present invention is to provide a method for producing a crucible of the aforementioned natures.

According to the present invention, the above and other objects can be accomplished by a method for producing a quartz crucible including steps of providing a quartz crucible substrate having a high bubble content by forming and heating powders of at least one of crystalline and non-crystalline silicon dioxides, rotating said substrate during or after the substrate is formed and producing a high temperature gas atmosphere in the substrate by means of heat source means inserted into said substrate, supplying a small quantity of powders of at least one of crystalline and non-crystalline silicon dioxides into said high temperature atmosphere to cause at least a part of said powder molten and to make said powders being dissipated toward an inner surface of said crucible substrate to be adhered thereto, so that a layer of substantially bubble free transparent quartz glass is formed integrally on the inner surface of the substrate.

According to the method of the present invention, at least a part of the powder is molten and the powders are adhered to the inner surface of the crucible substrate which is in a molten condition. Then, the powders thus deposited on the substrate are caused to melt under heat applied from the heat source means prior to that further powders of partly molten state are successively deposited on the inner surface of the crucible substrate. Thus, the deposits of the molten powders of silicon dioxides form a thin, substantially bubble free, transparent glass layer integrally on the inner surface of the crucible substrate. The substantially bubble free glass layer thus formed is produced on the substrate surface at least at a predetermined band width and has a predetermined thickness. The layer thus formed is made of powders which are completely molten and of a thin thickness so that it is very unlikely that any bubbles are contained therein.

The transparent glass layer is thus formed integrally with the substrate so that it is strongly adhered to the substrate. The transparent glass layer is uniform and substantially free from bubbles so that it is not likely that impurities in the layer be locally precipitated. In a pulling process for producing a single crystal, a bath of molten silicon is filled in the crucible and the inner surface of the crucible is maintained in contact with the silicon melt so that the crucible inner surface is eroded by the melt. It should however be noted that the surface of the crucible made in accordance with the present invention is maintained smooth as compared with a conventional crucible even after the erosion. It is therefore possible to suppress fluctuations of the surface of the silicon melt during the pulling process with the result that the yield is significantly increased. Since the transparent glass layer is uniform in property, the material in the layer can dissolve stably into the silicon melt so that the control of the oxygen content in the silicon melt can be ensured. A further important advantage is that it is possible to suppress the growth of crystobalite which has been experienced with the conventional quartz crucible during the pulling process in an area where the quartz crucible is brought into contact with the silicon melt. As the result, it is possible to suppress disturbances of the growth of the single crystal due to drop off of the crystobalite.

According to another aspect of the present invention, there is provided a quartz crucible including a quartz crucible substrate comprising an opaque quartz glass layer of a high bubble content and having an inner surface, and a substantially bubble free transparent quartz glass layer which is of a predetermined thickness and formed integrally on said inner surface of the substrate, said transparent quartz glass layer having a smooth inner surface. The transparent layer may be of a thickness not smaller than 0.3 mm but not more than 3.0 mm. Preferably, the transparent layer is of a thickness not smaller than 0.5 mm, most recommendably, between 0.8 and 1.5 mm. In accordance with the present invention, the term "substantially free from bubble" will mean that there is no bubble which is greater than 50 $\mu$m in diameter and bubbles of a diameter between 20 $\mu$m and 50 $\mu$m do not exist more than 10 each/cm². In actual practice, the transparent layer of a crucible made in accordance with the process of the present invention does not contain bubbles of 20 to 50 $\mu$m more than 2 each/cm².

According to a further aspect of the present invention, the crucible substrate contains crystalline quartz components. The crystalline components are effective in improving the physical stability of the crucible under an elevated temperature. It is preferred that the crystalline components are distributed in the vicinity of the outer surface of the crucible substrate.

The above and other objects and features of the present invention will become apparent from the following descriptions of preferred embodiments taking reference to the accompanying drawings.

DESCRIPTION OF THE PREFERRED EMBODIMENTS

Figure 1:
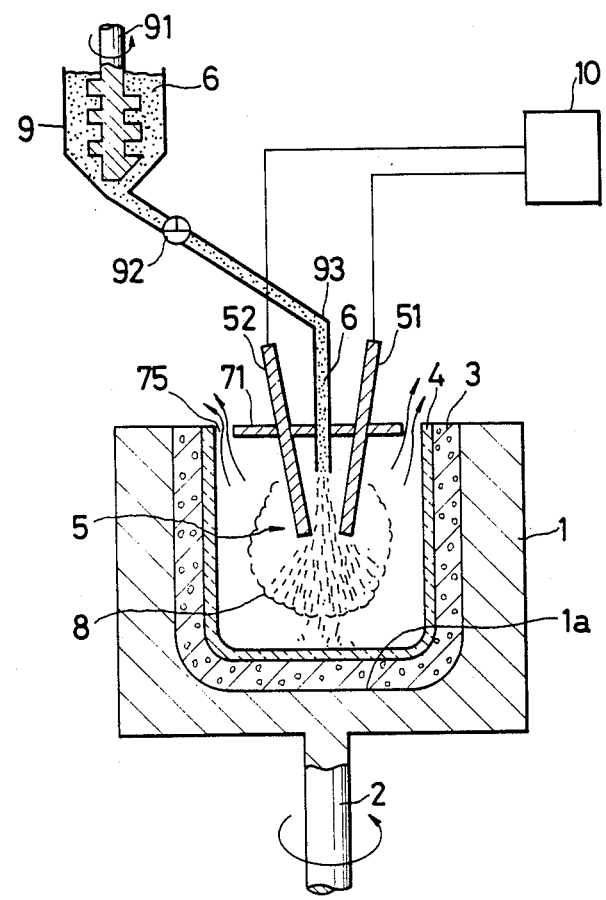
FIG. 1 is a sectional view of an apparatus for producing a crucible in accordance with one embodiment of the present invention.

Referring to the drawings, particularly to FIG. 1, there is shown a rotatable mould 1 which is provided with a rotating shaft 2. In the mould 1, there is a cavity 1a in which an opaque quartz crucible substrate 3 is disposed. The substrate 3 is prepared by forming powders of crystalline or non-crystalline silicon dioxides in an appropriate mould into a configuration of a crucible to form a pre-formed powder body, heating the powder body at the inside thereof to make the powders molten and cooling the preformed body. The mould 1 is rotated and a heat source 5 is inserted into the substrate 3. The substrate 3 has an opening at the upper end and the opening is closed by a closure 71 to leave a ringshaped slit opening 75. The heat source 5 produces a high temperature atmosphere 8 in the crucible substrate 3 and a small quantity of powders 6 of silicon dioxide of a high purity are supplied to the high temperature gas atmosphere 8. The powders 6 of silicon dioxide may be of a crystalline type, non-crystalline type or a mixture of the both. The powders 6 are directed toward the inner surface of the substrate 3 with at least a part of the powders 6 in a molten state. The powders 6 are deposited on the inner surface of the substrate 3 which is already in a molten state to integrally form a transparent quartz glass layer 4 on the substrate 3.

The powders 6 of the silicon dioxide are fed from a supply tank 9 having an agitating blade 91 by means of a metering feeder 92 to be discharged with a regulated rate through a nozzle 93. The mould 1 may be provided with a cooling mechanism of a conventional type. The configuration and the size of the mould 1 may be appropriately determined depending on the configuration and the size of the crucible to be produced. The mould 1 is made of a material having a satisfactory heat resistance and a mechanical strength. Further, the material for the mould 1 must have a property which makes it possible to form into a desired configuration.

In the embodiment shown in FIG. 1, a preformed opaque crucible substrate 3 is disposed in the mould 1 and a transparent glass layer 4 is deposited on the inner surface of the substrate 3. It should however be noted that powders of quartz may be charged into the mould 1 and distributed along the inner surface of the mould 1 to form a layer of a predetermined thickness which is then heated at the inner surface while the mould 1 is being rotated to make the powders of quartz molten and form a crucible substrate. During this process, there is formed a high temperature gas atmosphere 8 in the crucible substrate 3 which is being made and powders 6 of silicon dioxide may then be supplied into the high temperature atmosphere 8 while the substrate 3 is being formed. This process is advantageous in that the substrate and the crucible are formed in the same mould 1.

In the process of forming the crucible substrate 3, it is required to control the rotating speed of the mould 1 to an appropriate value. If the speed is excessive, the powders supplied to the mould 1 are forced radially outwardly so that there may be a shortage of the powders in the bottom area of the mould 1. In order to prevent uneven distribution of the powders for forming the substrate 3 in the mould 1, a scraping doctor blade may be used to make the powders to be distributed with an even thickness, surplus powders being discharged from the open top portion of the mould 1.

In forming the transparent glass layer 4, the rotating speed of the mould 1 may be determined in accordance with the supply of heat energy from the heat source 5 so that the molten deposit of silicon dioxide does not fall off from the inner surface of the substrate 3. In general, the rotating speed may be within 50 to 300 rpm.

The process for forming a quartz crucible in accordance with the present invention can be carried out in a normal air. However, in order to exclude foreign objects, it is preferred to carry out the process in a clean atmosphere which meets, for example, the class 1000 requirement in accordance with ASTM standard.

The heat source 5 may be of an apparatus for producing an arc discharge or a high frequency plasma discharge. It is preferable to use an arc discharge device including a pair of carbon electrodes 51 and 52 as shown in FIG. 1. The carbon electrodes 51 and 52 are connected with an external source 10 of an AC or DC power supply so that the electrodes 51 and 52 are subjected to a high voltage to produce an arc discharge. It is required that the heat energy thus supplied is of a sufficient value.

In the case where the arc discharge device having the carbon electrodes 51 and 52 is used, the heat is at first concentrated to the central portion of the bottom of the substrate to have the surface of the bottom of the substrate molten. Then, powders 6 of silicon dioxide are supplied to the high temperature gas atmosphere 8 which is formed in the substrate 3. The quantity of supply of the silicon dioxide powders 6 is appropriately controlled so that a desired thickness of deposit of the silicon dioxide powders 6 is formed on the substrate 3. The tip ends of the carbon electrodes 51 and 52 are moved along the inner surface of the substrate 3 in a vertical direction. It is possible to change the thickness of the transparent glass layer 4 depending on the location on the substrate 3 by appropriately adjusting the quantity of supply of the silicon dioxide powders 6 and the speed of movement of the carbon electrodes 51 and 52.

It is possible to radially offset the heat source 5. With this arrangement, there is a tendency that the deposit of silicon dioxide starts to be solidified as soon as it is moved away from the heat source 5. However, it is possible that the inner surface of the substrate and the deposit of silicon dioxide kept in a molten state until succeeding deposit of molten silicon dioxide is made through the appropriate control of the heat and the rotating speed of the mould 1. If the rotating speed of the mould 1 is excessively low, the substrate 3 may be locally overheated so that internal material of the substrate may be molten to an extent that the substrate may be deformed. Further, the surface portion of the transparent glass layer 4 may possess excessive fluidity so that the transparent glass layer 4 may be flown off the substrate 3. It is therefore required that the heat supply and the rotating speed of the mould 1 must be controlled as described previously.

The transparent glass layer 4 may be formed into a desired thickness through a single step. However, it is of course possible to move the carbon electrodes 51 and 52 repeatedly upward and downward so that layers are laid one over the other. In the case where the transparent glass layer 4 is formed while the crucible substrate 3 is being formed from powders of silicon dioxide, the silicon dioxide powders 6 for forming the transparent glass layer 4 are supplied while the powders for forming the substrate are substantially completely molten.

It will be noted that the arc discharge is of a bulged configuration so that the powders 6 of silicon dioxide which have passed through the high temperature gas atmosphere 8 are distributed throughout a wide range of the inner surface of the crucible substrate 3.

As shown in FIG. 1, the mould 1 and the substrate 3 have openings in the upper ends and the upper openings are closed by means of a closure 71 leaving a ring-shaped opening 75. Thus, the high temperature gas in the substrate 3 is allowed to flow upwardly along the inner surface of the substrate 3 to be exhausted through the ring-shaped opening 75 as shown by arrows in FIG. 1. It will therefore be understood that the silicon dioxide powders 6 which have passed through the high temperature gas atmosphere 8 are distributed under the function of the upwardly directed gas flow uniformly along the inner surface of the substrate 3. This function, together with the influence of the arc discharge, contributes to a uniform distribution of the silicon dioxide powders 6 throughout the inner surface of the substrate 3. It should further be noted that the substrate 3 is substantially closed by the closure 71 so that there will be produced an instantaneous expansion of the gas inside the substrate 3 in response to the arc discharge. It is therefore possible to increase the temperature inside the substrate 3 very rapidly. It is further possible to heat the substrate surface uniformly. As the result, the silicon dioxide powders deposit in a molten or partly molten state on the inner surface of the crucible substrate and form a substantially bubble free transparent glass layer. The transparent glass layer is integrally adhered to the substrate uniformly with a minimum thermal energy. The area of the opening of the substrate to be covered by the closure 71 may be dependent on the type of the heat source 5 and the size of the substrate 3. It is in general preferable that the closure 71 covers 20 to 95% of the opening in the substrate 3. The closure 71 may be of a diameter which is larger than the diameter of the upper opening of the substrate 3 and placed above the substrate with a desired spacing between the closure and the substrate 3.

Figure 2:
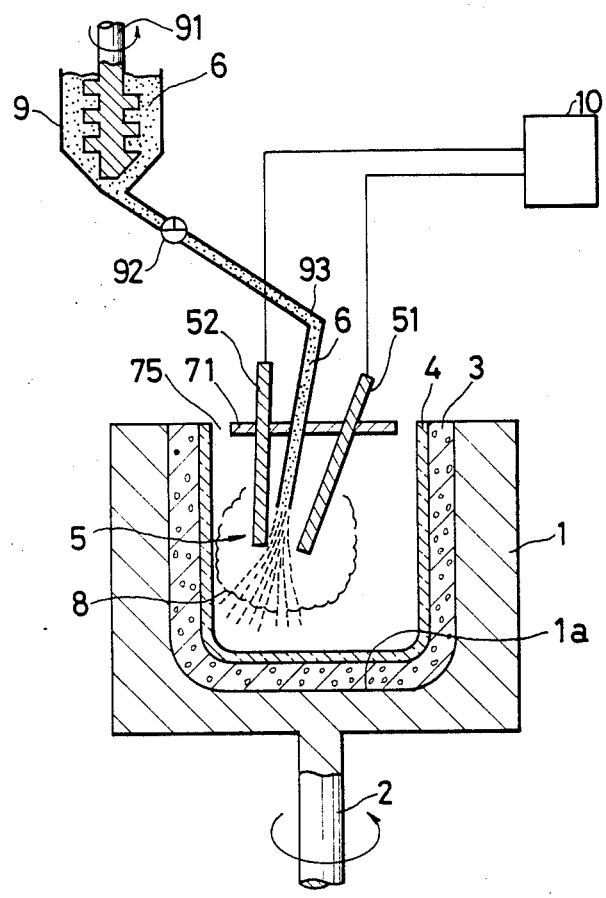
FIG. 2 is a sectional view of an apparatus for producing a crucible in accordance with another embodiment of the present invention.

Referring now to FIG. 2, there is shown another embodiment of the present invention. In the embodiment, the carbon electrodes 51 and 52 are inclined with respect to the axis of the rotating shaft 2 and have tip ends which are sidewardly offset with respect to the center of the substrate 3. With this arrangement, it is possible to control the area wherein the material in the vicinity of the inner surface of the substrate 3 is molten precisely in a desired manner. The nozzle 93 for discharging the silicon dioxide powders 6 may be inclined in the same direction so that the direction of discharge of the silicon dioxide powders 6 is aligned with the molten area. Thus, it is further possible to ensure intimate adhesion between the transparent glass layer 4 and the substrate 3.

Preferably, the silicon dioxide powders 6 used in the process of the present invention are of the size ranging between 30 and 1000 $\mu$m. With the powder size finer than this range, the powders 6 may be carried by the upwardly flowing gas without being adequately heated. With the powder size coarser than this range, the powders reach the inner surface of the substrate before heat is transmitted to core portions of the powders and may not be molten even with the heat which may thereafter be applied to the powders. Then, it may be possible that the transparent glass layer becomes uneven.

The quantity of supply of the silicon dioxide powders 6 may be determined in accordance with the heat energy supplied by the heat source 5, the speed of movement of the heat source 5 and the rotating speed of the mould 1. It is preferable that the powder supply rate is 5 to 300 g/min. It should be noted that even with the preferred ranges of the powder size and the powder supply rate it is further important to provide a sufficient amount of heat energy.

The silicon dioxide powders 6 for forming the transparent glass layer 4 may be either of crystalline type or of non-crystalline type but they should be of a high purity so that impurities in the transparent glass layer 4 can be minimized. Since the transparent glass layer 4 is of a high purity, the silicon dioxide powders for forming the substrate 3 may not be of a high purity so that the manufacturing cost of the crucible can be decreased.

According to the present invention, the transparent glass layer 4 is formed on the inner surface of the crucible substrate 3 by supplying a metered quantity of silicon dioxide powders 6 in a molten or partly molten form to be deposited on the inner surface of the substrate 3. It is therefore very unlikely that bubbles are entrapped between the powder particles. By using silicon dioxide powders of a high purity, it is possible to decrease impurities and hydroxides in the transparent glass layer 4.

In the case where powders of natural quartz are used for forming the transparent glass layer 4, the quantity of hydroxides in the layer 4 will be small because the hydroxide content in natural quartz is relatively low and the hydroxide content in the layer 4 can be maintained within the corresponding value of natural quartz. When the silicon dioxide powders 6 are passed through the high temperature atmosphere 8, a part of the hydroxides in the powders may be separated and at the same time a part of impurities may be dissipated. The thickness of the transparent glass layer 4 can be conveniently and accurately controlled by adjusting the quantity of supply of the silicon dioxide powders 6 and the rotating speed of the mould 1.

According to the present invention, the number of the carbon electrodes can be increased without any difficulty. It is further possible to determine the positions of the electrodes as desired. The heat source 5 may be comprised of a hydrogen burner. In this case, since the temperature of the burner is low as compared with that of the arc discharge device or the high frequency discharge device, the silicon dioxide powders 6 must be of a finer particle size and the supply rate must be decreased. It will also be necessary to decrease the moving speed of the heat source 5. This process will however cause an increase in the quantity of hydroxides in the transparent glass layer 4 so that the heat resistance in the layer 4 will be weakened to a certain extent.

Figure 3:
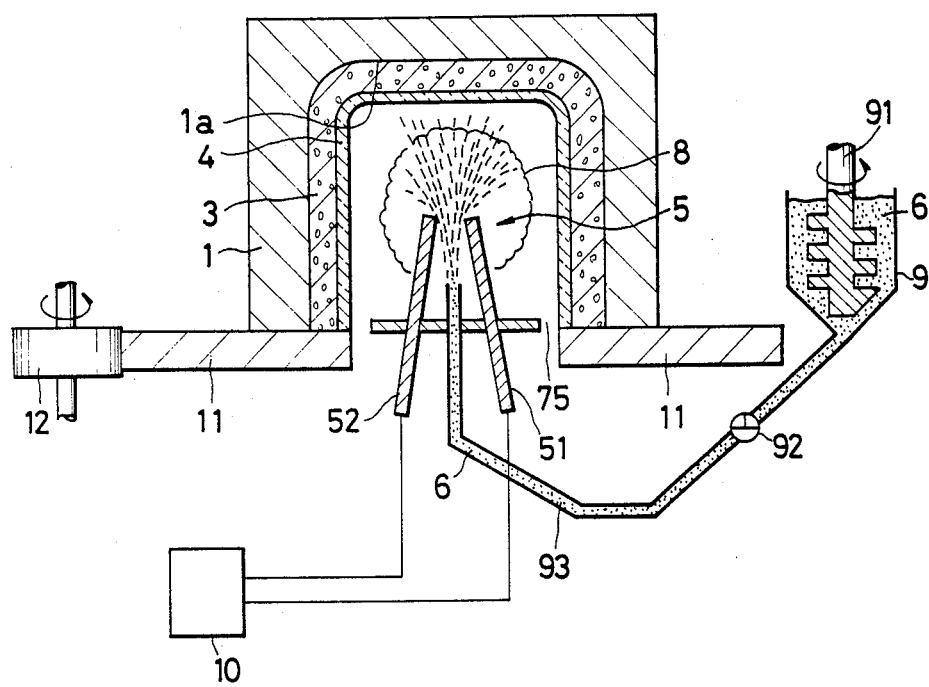
FIG. 3 is a sectional view of an apparatus in accordance with a further embodiment of the present invention.

Referring to FIG. 3, there is shown a further embodiment of the present invention. In this embodiment, the mould 1 is placed upside down with the opening directed downward. The substrate 3 is in the mould 1. The heat source 5 and the nozzle 93 are inserted into the substrate 3 from the lower side through the opening of the substrate 3. The substrate 3 in the mould 1 is supported by a support member 11. The mould 1 and the substrate 3 are rotated through the support member 11.

As described, the transparent glass layer 4 provided in accordance with the present invention is characterized by the facts that it is uniform and substantially free from bubbles. Therefore, even if the single crystal pulling process is carried out under a reduced pressure, there will be no remarkable expansion of bubbles in the transparent glass layer 4. It is also possible to control accurately the quantity of oxygen transferred to the silicon melt during the pulling process. In the crystal pulling process, the inner surface of the crucible is maintained in contact with the silicon melt so that there takes place a chemical reaction to have the material of the crucible dissolved into the silicon melt. Since the crucible in accordance with the present invention has inner surface which is of a high purity and substantially free from bubble so that the aforementioned dissolution is stable and a controlled amount of oxygen is applied to the silicon melt. It should further be noted that the transparent glass layer 4 is substantially free from bubbles so that the inner surface of the crucible can be maintained smooth even if the surface area of the crucible is subjected to the aforementioned chemical reaction. According to the crucible of the present invention, it is possible to avoid concentration of metallic impurities which has been experienced in a conventional crucible having an inner layer which contains noticeable bubbles. Thus, it is possible to suppress the growth of crystobalite.

The term "substantially bubble free" herein used means that the bubble content is significantly small as compared with a crucible produced in a conventional process. Conventional opaque quartz glass crucibles used for the growth of a single crystal generally contain a lot of bubbles of 100 μm to 1 mm in diameter which is noticeable through human eyes as well as bubbles which can be recognized through light scattering. To the contrary, the crucible in accordance with the present invention does not contain such noticeable bubbles. As an example, six crucibles, each having a transparent layer of 0.8 mm thick, are produced in accordance with the process of the present invention and observations are made through a microscope to detect bubbles with the opaque layer removed from the transparent layer. In each of the test samples, four inspection regions in the side wall portion and one inspection region in the bottom portion, each having 8 mm$^2$ area, are determined. The results of the observations showed that only 2 to 3 bubbles of diameter greater than 20 μm are found. More specifically, two such bubbles are found in one inspection region and one bubble is found in two inspection regions. Thus, the bubble distribution is in average approximately 1.6 each/cm$^2$.

It is required that the transparent glass layer provided on the inner wall surface of the crucible is not less than 0.3 mm thick but not more than 3.0 mm. Preferably, the thickness of the transparent glass layer is not smaller than 0.5 mm and most recommendably 0.8 to 1.0 mm. If the layer is less than 0.3 mm in thickness, the layer may be lost during the single crystal pulling process because the layer is gradually dissoved into the silicon melt in the crucible. If the layer is excessively thick, the merit of providing the opaque crucible substrate may be lost.

The opaque substrate 3 contains a lot of bubbles of 20 to 250 μm in diameter. The concentration of such bubbles should preferably be more than 20,000 each/cm$^2$. More preferably, the bubbles are concentrated toward the outer surface of the crucible. For example, in the area of 60% thickness as measured from the outer surface, the concentration should preferably be 40,000 to 70,000 each/cm$^2$. The high bubble content in the substrate is found effective to provide a uniform heat transfer from the outer surface to the inner surface of the crucible to thereby eliminate temperature difference throughout the surface of the crucible. As the results, the crucible is subjected to a uniform heating throughout the inner surface so that the crystal pulling operation can be carried out with an improved stability. If the bubble concentration is low, a sufficient diffusion of heat will not be obtained. If the bubble concentration is too high, the strength of the substrate will be decreased. Further, there will be a possibility of the bubbles getting together to form bubbles of larger sizes.

It is further preferable that the crucible substrate 3 contains crystalline quartz components which are distributed in the crucible. With this structure, it is possible to improve the physical stability of the crucible under a temperature close to the melting point of silicon, that is, approximately 1450° C. Therefore, it is possible to prevent deformation of the crucible during the crystal pulling process even if there is a gap between the crucible and a support for the crucible.

Examples of the present invention will now be described.

EXAMPLE 1

Figure 4:
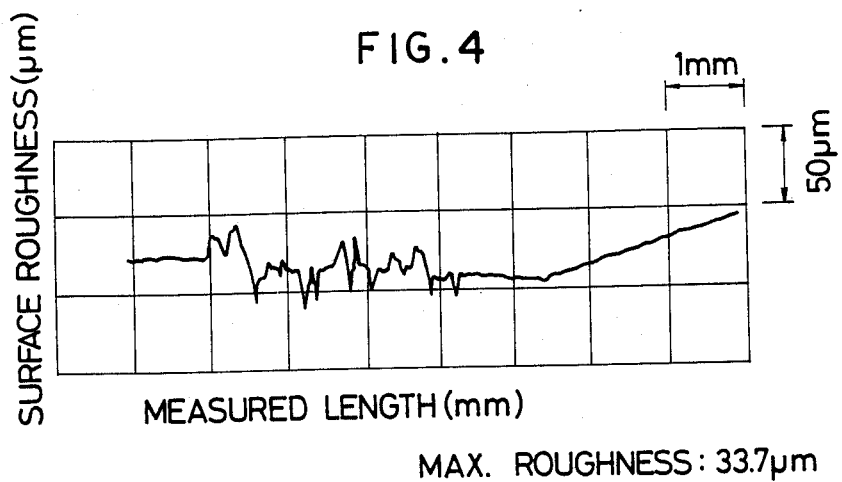
FIG. 4 is a diagram showing the roughness of the inner surface of a quartz crucible made in accordance with the present invention and used for pulling a single crystal.

A quartz crucible of 14 inches in diameter was produced in accordance with the process of the present invention. In the process, the opaque substrate was formed from 6 Kg of quartz powders of 150 to 300 μm powder size with the mould rotating speed of 100 rpm. The transparent layer was formed from 875 g of quartz powder of the same particle size, the supply rate of the powders being 125 g/min. to yield a layer of 0.8 mm thick. Heating was made by an arc discharge using a pair of carbon electrodes. Total heating time was 16 minutes. A comparative sample of a conventional quartz crucible of 14 inches in diameter was also produced. The comparative sample was of an opaque structure having a smooth inner surface. These sample crucibles were used for single crystal pulling processes for 40 hours and the inner surfaces were inspected by measuring surface roughness with a measuring instrument available from Kosaka Institute in Japan to find out the effect of the present invention. FIG. 4 shows the roughness of the inner surface of the crucible made in accordance with the present invention, whereas FIG. 5 shows the roughness of the conventional crucible.

Figure 5:
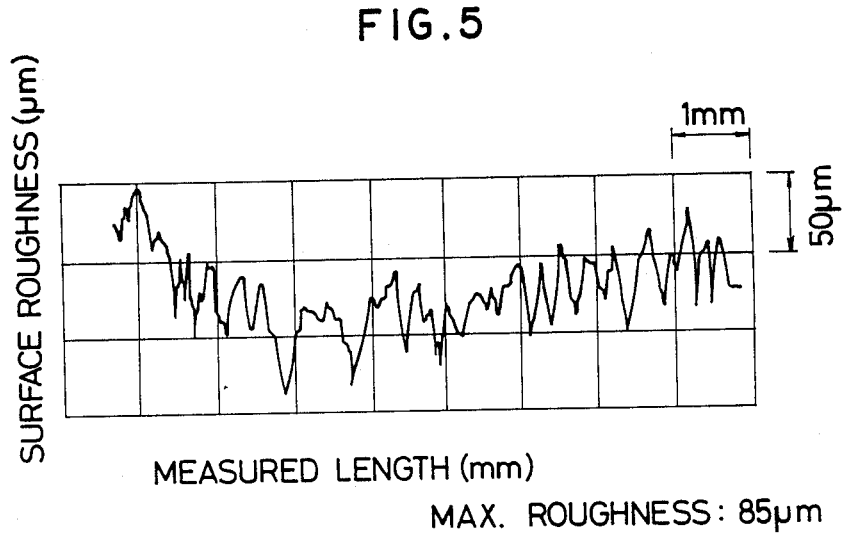
FIG. 5 is a diagram showing the roughness of the inner surface of a conventional quartz crucible after the crucible is used for pulling a single crystal.

In FIGS. 4 and 5, it will be noted that the maximum roughness of the crucible of the present invention is only 33.7 μm but the roughness in the conventional one is approximately 2.5 times as large as that of the present invention.

Figure 6A:
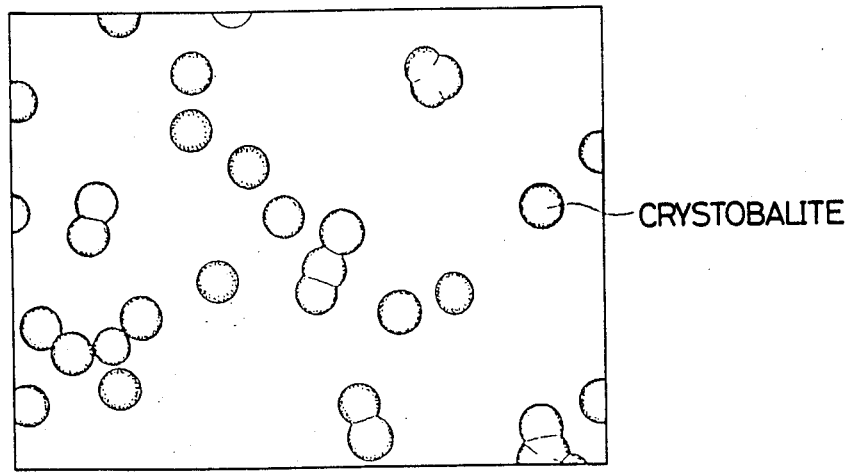
FIG. 6A is a view of the inner surface of a crucible made in accordance with the present invention and used for a single crystal pulling process.
Figure 6B:
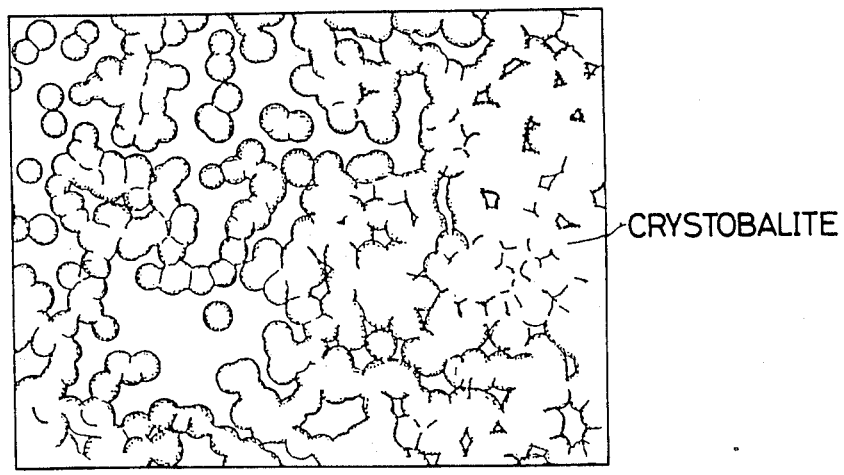
FIG. 6B is a view of the inner surface of a conventional crucible after it is used for a single crystal pulling process.

FIGS. 6A and 6B show devitrification of the crucible at the inner surface after the crucible was used for the pulling process. It will be noted that crystobalites are much lesser in the crucible of the present invention than in the conventional crucible. In other words, the inner surface of the crucible of the present invention is very uniform and has less projections which may become nucleus for the growth of crystals so that there is less possibility of formation of crystobalites which cause devitrification.

EXAMPLE 2

Crucibles were produced as in the Example 1 and each of the sample crucibles was used for a crystal pulling process. In the pulling process, the atmosphere was maintained at a pressure of 10 mb. The process was carried out by rotating the moulds at a speed of 10 rpm in a direction opposite to the direction of rotation of the seed crystal. The pulling speed was maintained at 0.5 mm/min. and a single crystal having a length of 90 cm and a diameter of 100 mm was pulled. The operation time of the pulling process was 40 hours. Single crystal growth success ratio is shown in Table 1 for each single crystal ingot.

The term success ratio is used to mean the ratio of the ingots in which single crystal was successfully formed to the total number of ingots formed in the batch.

TABLE 1

| sample crucible | success ratio | number of repetition |
|---|---|---|
| invention | 75 | 8 |
| prior art | 40 | 10 |

In the Table 1, it will be noted that with the crucible of the present invention the single crystal pulling process can be accomplished in a stable manner. It is understood that the success ratio with the conventional crucible is low because there will be produced rough areas in the inner surface and there will be a growth of crystobalites.

Measurements were made to detect the concentrations of bubbles having a diameter greater than 20 μm in the crucibles used in the above pulling processes in the manner as stated previously. The results of measurements are shown in Table 2. Further, sections at the side wall portions and the bottom portions of the crucibles are shown in FIGS. 7 and 8.

TABLE 2

| crucible | number of bubbles greater than 20 μm |
|---|---|
| invention | less than 5 |
| prior art | more than 500 |

Figure 7A:
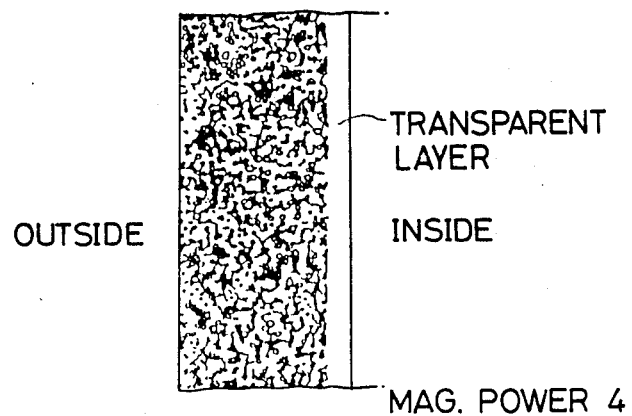
FIGS. 7A and 7B are sectional views of wall portions of a crucible in accordance with the present invention which has been used for a pulling process.
Figure 7B:
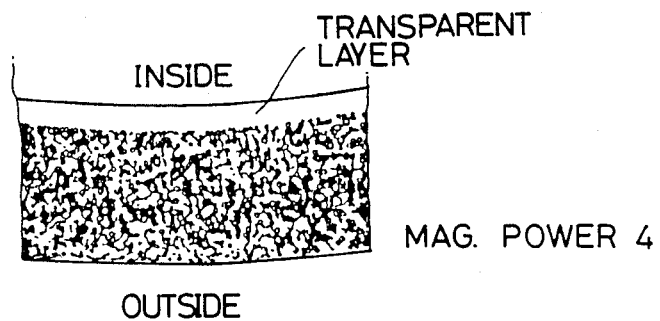
Figure 8A:
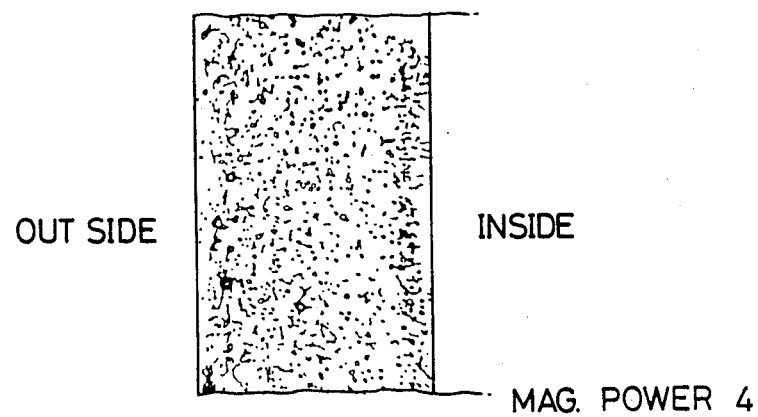
FIGS. 8A and 8B are sectional views of wall portions of a conventional crucible which has been used for a pulling process.
Figure 8B:
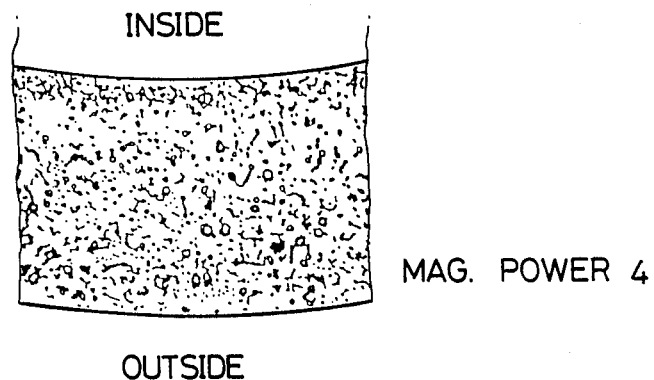

It will be noted herein that the crucibles are maintained at a temperature as high as 1450° C. and subjected to a reduced pressure for a long time in the pulling process so that the bubbles are expanded to visible sizes even though they may not be visible when the crucibles are produced. As shown in FIGS. 7A and 7B, however, the crucible in accordance with the present invention has a substantially bubble free transparent glass layer even after it is used for the pulling process. To the contrary, as shown in FIGS. 8A and 8B and Table 2, there appear a lot of visible bubbles in the conventional crucible after it is used for the pulling process.

EXAMPLE 3

Samples 1 and 2 of crucibles were produced as in Example 1 in accordance with the present invention. The crucibles were placed on single crystal pulling apparatus and the empty crucibles were heated to an operating temperature. Then, measurements were made to find out temperature differences on the inner surfaces. It has been found that the temperature difference in the sample 1 is approximately plus and minus 3° C. and the temperature difference in the sample 2 is approximately plus and minus 5° C.

Similar tests were made with comparative samples 1 and 2 which were prepared in a conventional process as in Example 1. The temperature difference in the comparative sample 1 was plus and minus 10° C. and that in the comparative sample 2 was plus and minus 13° C. It will be noted in these tests that the crucibles in accordance with the present invention provides a uniform heat transfer. Particularly, in the case of the comparative sample 2, the bubble concentration ranged between 13,000 each/cm$^2$ and 60,000 each/cm$^2$ and this crucible showed an abrupt temperature difference.

EXAMPLE 4

Tests were made with samples 1 and 2 which were prepared in accordance with the present invention as in Example 3 and with comparative samples 1 and 2 which were prepared in a conventional process as in Example 3 by using the samples in pulling processes as set forth in the Example 2 except that single crystal ingots of 150 mm in diameter and 70 cm in length were pulled. The success ratio in each crucible is shown in Table 3.

TABLE 3

| crucible | success ratio | |
|---|---|---|
| | 1st ingot | 2nd ingot |
| sample 1 | 100% | 90% |
| sample 2 | 98% | 80% |
| comp. 1 | 90% | 40% |
| comp. 2 | 80% | 42% |

It will be noted that the crucible in accordance with the present invention is effective for the stable production of single crystals.

EXAMPLE 5

Figure 9A:
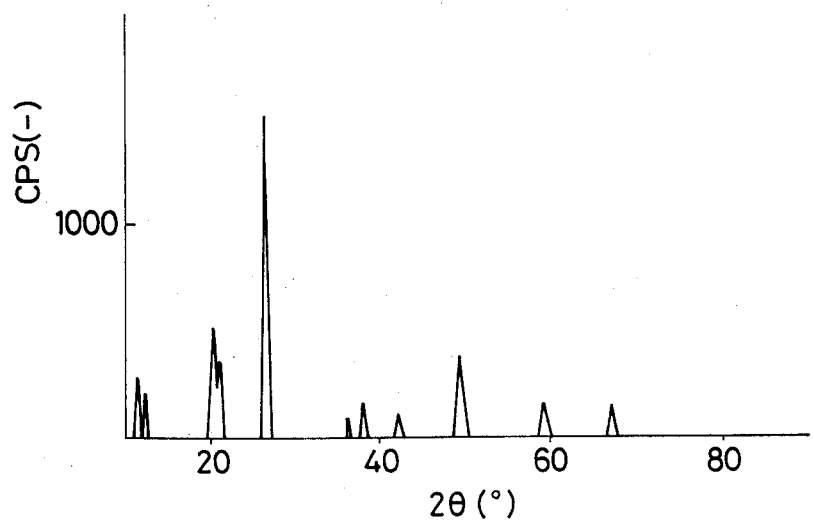
FIGS. 9A and 9B are X-ray diffraction diagrams showing the crystalline components in a crucible in accordance with another embodiment of the present invention; and, FIGS. 9C and 9D are X-ray diffraction diagram similar to FIGS. 9A and 9B but showing a conventional crucible.
Figure 9B:
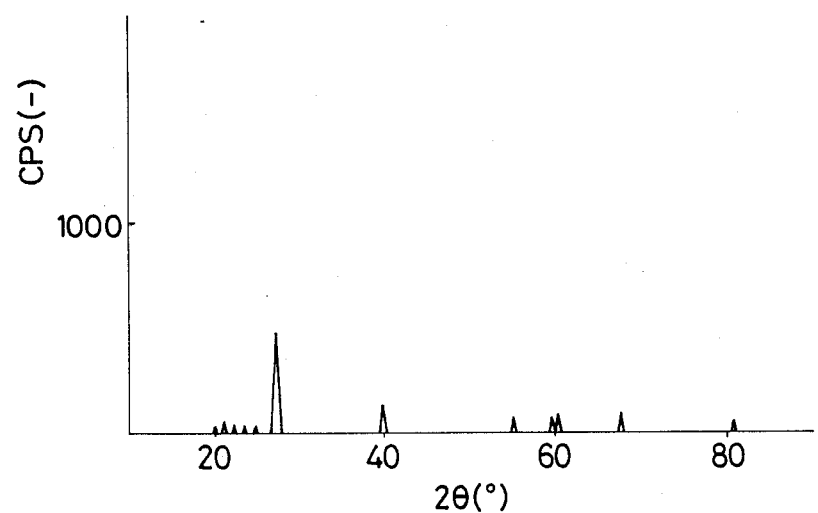
Figure 9C:
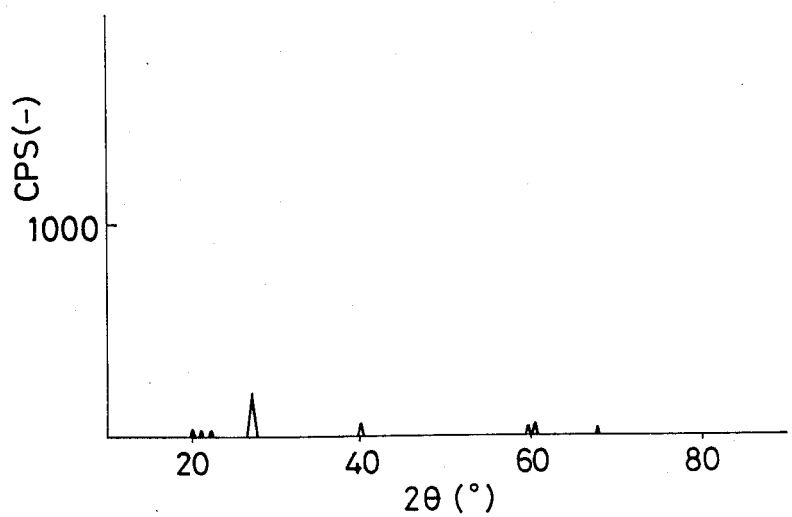
Figure 9D:
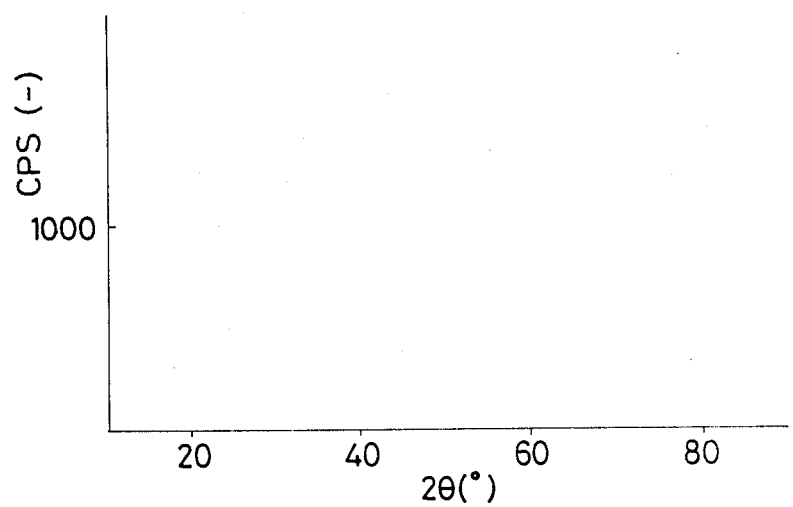

Two quartz crucibles of 14 inches diameter were produced in accordance with the present invention. The crucibles were identified as samples 1 and 2 as in Example 3. Comparative examples 1 and 2 were prepared in a conventional manner as in Example 3. The structures of these crucibles are shown in Table 4. FIG. 9A shows X-ray diffraction diagrams at the external surface of the sample 1, whereas FIG. 9B shows a similar diagram at a portion 1 mm inside from the external surface. FIGS. 9C and 9D correspond respectively to FIGS. 9A and 9B but shows the results obtained by the comparative sample 1.

TABLE 4

| sample | crystalline in substrate | bubble dia. ( ) aver | bubble conc. ea./cm² |
|---|---|---|---|
| sample 1 | yes (at ext. surface) | 20 to 170 (86) | 52,000 to 56,000 |
| sample 2 | yes | 24 to 230 (103) | 20,000 to 35,000 |
| comp. 1 | few | 20 to 100 (70) | 9,000 to 17,000 |
| comp. 2 | few | 200 to 400 (320) | 13,000 to 60,000 |

In order to verify the effects of the crystalline components in the crucible substrate, the samples 1 and 2 and the comparative samples 1 and 2 were supported by supports with gaps of 10 mm and each crucible was charged with 10 kg of polycrystalline silicon. Then, the silicon was molten under a temperature of 1450° C. and maintained in that temperature for 20 hours. It has been found that in the case of the samples 1 and 2, the gaps were decreased respectively to 8 mm and 7 mm. In the case of the comparative samples 1 and 2, the gaps were decreased respectively to 2 mm and 1 mm. It will therefore be understood that the crucible of the present invention shows an improved physical stability under an elevated temperature.

Crucible samples 3 and 4 were made in accordance with the present invention to have an external diameter of 150 mm and each crucible was cut into a tubular form. The samples were then laid in a electric furnace with a side wall placed on the floor. The samples were then heated to 1300° C. and maintained at that temperature for 18 hours. Similar tests were made for comparative samples made in a conventional manner. It has been found that there were changes in diameter in the comparative samples respectively by 30 mm and 35 mm, however, the samples 3 and 4 showed diameter changes only by 7 mm and 8 mm, respectively.

The invention has thus been shown and described with reference to specific examples, however, it should be noted that the invention is in no way limited to the details of the examples and the embodiments but changes and modifications may be made without departing from the scope of the appended claims.

We claim:

1. Method for producing quartz crucible comprising steps of providing a crucible substrate made of silicon dioxide having a high bubble content, rotating said substrate in a condition disposed in mould means and forming a high temperature gas atmosphere in said substrate, supplying powders of silicon dioxide to said high temperature atmosphere to have the silicon dioxide powders molten at least partly and having said silicon dioxide powders directed toward an inner surface of said substrate so that the silicon dioxide powders in at least partly molten form are deposited on the inner surface of the substrate to form a transparent quartz glass layer on said inner surface of the substrate, said transparent quartz glass layer being of a predetermined thickness and substantially free from bubbles.

2. A method for producing a quartz crucible comprising steps of providing mould means, supplying first powders of silicon dioxide to said mould means, rotating said mould means and having said first powders distributed along an inner surface of said mould means to form a powder layer of a crucible configuration, heating said powder layer from inside of the mould means to have the first powders molten to provide a crucible substrate having a high bubble content, forming a high temperature gas atmosphere in said mould means, supplying second powders of silicon dioxide into said high temperature gas atmosphere to have the second powders molten at least partly, directing the second powders in at least partly molten form toward inner surface of the substrate to have the second powders deposited on said inner surface of the substrate to thereby form a transparent quartz glass layer on said inner surface of the substrate, said glass layer being of a predetermined thickness and substantially free from bubbles.

3. Method in accordance with claim 2 in which the steps of forming said substrate and forming said glass layer are carried out simultaneously.

4. Method in accordance with claim 2 in which said first powders at least partly contain crystalline powders.

5. Method in accordance with claim 1 or 2 in which said substrate has an opening at one end which is partly closed so that a ring-shaped opening is left so that high temperature gas is directed from said atmosphere along the inner surface of the substrate through said ring-shaped opening to be exhausted.

6. Method in accordance with claim 1 or 2 in which said high temperature gas atmosphere is formed by arc discharge means.

7. Method in accordance with claim 1 or 2 in which said powders of silicon dioxide are of particle size of 30 to 1000 μm and supplied at a rate of 5 to 300 g/min.

8. Method in accordance with claim 3 in which said substrate has an opening at one end which is partly closed so that a ring-shaped opening is left so that high temperature gas is directed from said atmosphere along the inner surface of the substrate through said ring-shaped opening to be exhausted.

9. Method in accordance with claim 3 in which said high temperature gas atmosphere is formed by arc discharge means.

10. Method in accordance with claim 3 in which said powders of silicon dioxide are of particle size of 30 to 1000 μm and supplied at a rate of 5 to 300 g/min.

* * * * *